(12) United States Patent
Vincent et al.

(10) Patent No.: US 11,777,445 B2
(45) Date of Patent: Oct. 3, 2023

(54) METHODS OF AND APPARATUS FOR LOCATING ENERGY HARVESTING DEVICES IN AN ENVIRONMENT

(71) Applicant: Arm Limited, Cambridge (GB)

(72) Inventors: Hugo John Martin Vincent, Cambridge (GB); Graham Paul Hazel, Cambridge (GB)

(73) Assignee: Arm Limited, Cambridge (GB)

( * ) Notice: Subject to any disclaimer, the term of this patent is extended or adjusted under 35 U.S.C. 154(b) by 842 days.

(21) Appl. No.: 16/616,941

(22) PCT Filed: Jun. 1, 2018

(86) PCT No.: PCT/GB2018/051516
§ 371 (c)(1),
(2) Date: Nov. 25, 2019

(87) PCT Pub. No.: WO2018/220405
PCT Pub. Date: Dec. 6, 2018

(65) Prior Publication Data
US 2020/0153385 A1    May 14, 2020

(30) Foreign Application Priority Data
Jun. 1, 2017  (GB) ...................................... 1708745

(51) Int. Cl.
*H02S 50/15*        (2014.01)
*G06F 30/20*        (2020.01)
(Continued)

(52) U.S. Cl.
CPC .............. *H02S 50/15* (2014.12); *G01R 31/40* (2013.01); *G06F 30/20* (2020.01); *G06Q 10/06* (2013.01); *G06T 7/60* (2013.01)

(58) Field of Classification Search
None
See application file for complete search history.

(56) References Cited

U.S. PATENT DOCUMENTS 10,366,287 B1 *  7/2019  Loveland ............... G06V 20/58
2013/0293152 A1   11/2013  Barroso
(Continued)

FOREIGN PATENT DOCUMENTS

| JP | 2006114838 | 4/2006 |
|----|------------|--------|
| JP | 2011229313 | 11/2011 |

OTHER PUBLICATIONS

PCT International Search Report dated Jul. 6, 2018, PCT Patent Application PCT/GB2018/051516.
(Continued)

*Primary Examiner* — Jeffrey J Chow
(74) *Attorney, Agent, or Firm* — Vierra Magen Marcus LLP

(57) ABSTRACT

When placing an energy harvesting electronic device in an environment, such as a room, the amount of light energy that will be available at different locations in the environment is predicted (34) by using a physically based lighting model to simulate the interaction of light from light source or sources in the environment with the geometry in the environment. The predicted amount of light energy at different locations in the environment is then used to generate a display (42) to the user indicating the suitability of locations in the environment for a light energy harvesting electronic device that is to be placed in the environment.

16 Claims, 7 Drawing Sheets

(51) Int. Cl.
*G06T 7/60* (2017.01)
*G01R 31/40* (2020.01)
*G06Q 10/06* (2023.01)

(56) References Cited

U.S. PATENT DOCUMENTS

2016/0285416 A1    9/2016    Tiwari
2017/0228913 A1*    8/2017    Kogan .................... G06T 19/20

OTHER PUBLICATIONS

PCT Written Opinion of the International Searching Authority dated Jul. 6, 2018, PCT Patent Application PCT/GB2018/051516.
GB1708745.3—Office Action dated Mar. 23, 2020, 3 pages.
GB Search Report dated Oct. 31, 2017, GB Patent Application No. GB1708745.3.
Christian Bach, Oct. 2010, "Indoor lighting conditions—placement of solar powered sensor units", EnOcean, [online], Available from https://www.enocean.com/fileadmin/redaktion/pdf/app_notes/AN201_SOLAR_UNIT_MOUNTING_OctI0.pdf [Accessed Oct. 25, 2017] See abstract and section 2.

* cited by examiner

METHODS OF AND APPARATUS FOR LOCATING ENERGY HARVESTING DEVICES IN AN ENVIRONMENT

BACKGROUND

The technology described herein relates to the locating of energy harvesting devices, and more particularly to the locating of light (solar) energy harvesting devices to be used as part of an Internet of Things network in an, e.g., indoor environment, such as a room or rooms of a building, for example.

It is becoming increasingly desirable to arrange networks of relatively small-scale processing devices that have processing and communication capabilities that are able to interact with each other in environments such as a room or rooms within a building. Such small-scale processing devices may be in communication with each other and to a central platform or platforms as part of a so-called Internet of Things (IoT) network. In general, small processing devices which create a data stream (e.g. temperature/pressure/movement sensors or cameras) may be configured to provide data to a centralised control system which acts on the information provided by the processing devices.

For example, devices such as sensors may be arranged within a building and then used to control the environment of the building, such as by enabling or disabling lighting, temperature control, etc. A greenhouse may have sensors monitoring the plants being cultivated as well as their environment, and be operable to control inputs such as water, lighting and other nutrients so as to optimise growing conditions within the greenhouse.

An Internet of Things device (node) for use in such a system will typically have relatively limited processing and communication capabilities so as to allow it to perform some form of processing and to communicate with other devices within the overall "Internet of Things" network in question. As such Internet of Things devices (nodes) are intended to be able to operate in a remote, standalone fashion, they will typically require their own internal power source (rather than, e.g., being connected to any mains supply). Such an internal power supply may be provided, for example, by means of a battery. While it would be possible simply to replace the battery in an Internet of Things device when the battery is drained, it is becoming increasingly common and preferable for Internet of Things devices to include some form of energy harvesting system, so that they can derive power (and, e.g., and in an embodiment, recharge their batteries) from the environment. Many Internet of Things devices will accordingly comprise some form of light (solar) energy harvesting system so as to allow them to recharge their batteries by harvesting energy from ambient light in their environment.

An increasingly important aspect therefore of provisioning an Internet of Things device network in an environment, such as a room or rooms within a building, is to place the individual devices so that they should receive sufficient energy from light sources within the environment to meet their power requirements. This is made more difficult by the typically highly variable amount of light energy that may be available in different locations in an environment.

The Applicants believe that there remains scope for improved methods and apparatus for determining a suitable location for a light energy harvesting device in an environment.

BRIEF DESCRIPTION OF THE DRAWINGS

Various embodiments of the technology described herein will now be described by way of example only and with reference to the accompanying drawings, in which.

Like reference numerals are used for like components throughout the drawings, where appropriate.

DETAILED DESCRIPTION

Figure 1:
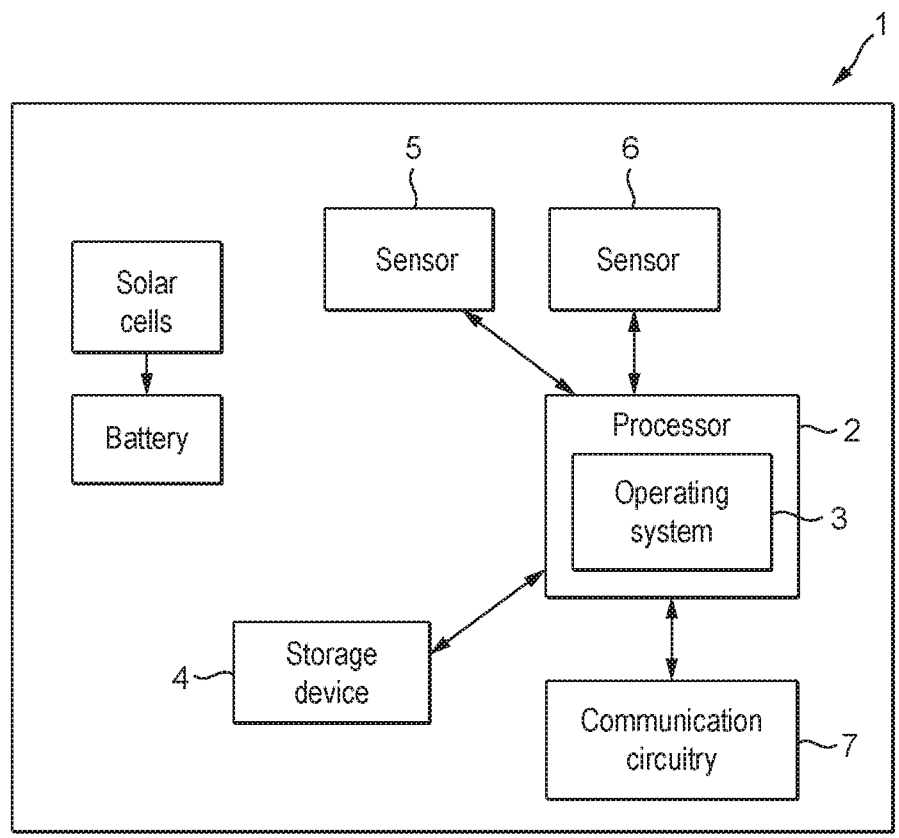
FIG. 1 illustrates schematically an Internet of Things device.

A first embodiment of the technology described herein comprises a method of identifying a location for a light energy harvesting electronic device within an environment, the method comprising:

providing data representative of a light source or sources and geometry in the environment in which the light energy harvesting electronic device is to be located;

using a physically based lighting model to simulate the interaction of the light from the light source or sources with the geometry in the environment based on the data representative of a light source or sources and geometry in the environment; and using the simulated interaction of the light from the light source or sources with the geometry in the environment to predict the amount of light energy that will be available at different locations in the environment, thereby to allow a location or locations suitable for the light energy harvesting electronic device in the environment to be identified.

A second embodiment of the technology described herein comprises an apparatus for identifying a location for a light energy harvesting electronic device within an environment, the apparatus comprising:

a processor configured to:

use a physically based lighting model to simulate the interaction of light from a light source or sources with geometry in an environment based on data representative of a light source or sources and geometry in the environment;

and to use the simulated interaction of the light from the light source or sources with the geometry in the environment to predict the amount of light energy that will be available at different locations in the environment, thereby to allow a location or locations suitable for a light energy harvesting electronic device in the environment to be identified.

The technology described herein uses a physically based lighting module to simulate the interaction of light with the geometry in an, e.g. indoor, environment in which a light energy harvesting electronic device is to be located. That simulation is then used to predict the amount of light energy that will be available at different locations in the environment. This can then allow a suitable location for a light energy harvesting electronic device within the environment to be identified (e.g., and in an embodiment, based on the light energy requirements needed to power the device).

The Applicants have recognised in particular that a physically based lighting module can be used to simulate the interaction of light within an environment and hence can be used to predict the amount of light energy that would be present at different locations within the environment. This can then facilitate the placement of light energy harvesting electronic devices, such as Internet of Things nodes, within the environment so as to (try to) ensure that they will receive sufficient light energy for their power requirements. This is advantageous, as it can provide more accurate positioning of light energy harvesting electronic devices in an environment than conventional techniques, which may more be based, for example, on "trial and error".

Furthermore, as will be discussed further below, the techniques of the technology described herein may be able to take account of a wider number of both environmental and other factors to allow more suitable locating of electronic devices within an environment.

The light energy harvesting electronic device for which a location is to be identified can be any suitable and desired electronic device that has light energy (solar energy) harvesting capabilities. The light energy harvesting capabilities of the device may be provided in any suitable and desired manner, e.g., and in an embodiment, by the use of appropriate photovoltaic cells.

The electronic device in an embodiment has an internal power supply, such as a battery, e.g., and in an embodiment, that is recharged by light energy harvesting.

In an embodiment, the electronic device has appropriate processing capabilities, suitable storage such as a memory, and communication capabilities to allow it to communicate, in an embodiment wirelessly, with other electronic devices. The electronic device is in an embodiment an Internet of Things device (node).

The electronic device may have any suitable and desired functionality and operation, such as, for example, acting as a sensor (e.g. for temperature, pressure, movement or other environmental factors, or plant ripeness/growth/lifecycle, signs of disease, for example), or otherwise. It in an embodiment generates a data stream that it can provide to a "centralised" control system.

The environment that is being considered in the technology described herein can comprise any suitable and desired environment. It in an embodiment comprises an appropriate space (volume) within which the electronic device is to be located. It in an embodiment comprises an indoor environment, such as, and in an embodiment, a room (within a building) (but it could also comprise a group of plural rooms, a building, etc., if desired).

The light source or sources in the environment that are being considered can be any suitable and desired light source or sources. Thus they may comprise artificial and/or natural sources of light, such as, and in an embodiment, artificial lights, and windows or other apertures through which natural light may enter the, e.g. indoor, environment. In an embodiment plural light sources in the environment are considered, and in an embodiment all of the potential light sources in the environment are considered.

Correspondingly, the geometry in the environment that is being considered can be any suitable and desired geometry of the environment.

The geometry that is considered in an embodiment comprises surfaces within the e.g., indoor environment, and in an embodiment plural and in an embodiment each, surface in the environment that may interact with light within the environment. It also or instead, and in an embodiment also, comprises geometry corresponding to plural, and in an embodiment all, of the objects that may interact with light in the environment. Thus the geometry may, and in an embodiment does, comprise, for example, the boundaries (e.g. walls, floor and ceiling) of the, e.g. indoor, environment, and one or more (and in an embodiment all of the) objects within the, e.g. indoor, environment.

The data representative of the light sources and geometry in the environment can comprise any suitable and desired such data that can be representative of a light source or geometry.

In the case of a light source, the data representative of the light source is in an embodiment indicative of at least one of, and in an embodiment plural of, and in an embodiment all of: the type of light source (e.g. whether it is natural or artificial light, and in the case of artificial light at least, the type or nature of the artificial light); the size of the light source; the position of the light source in the environment; the light output of the light source (e.g., and in an embodiment, in terms of its intensity, colour and/or spectrum); and any other, e.g., material, properties of the light source that may govern, e.g., and in an embodiment, the dispersal of light from the source and the amount and nature of light energy that will be provided by the light source. A standardised light description (e.g. an IES light profile) could be used for this purpose.

In the case of geometry (e.g. representing a surface and/or an object), the data representative of that geometry in an embodiment comprises one or more of, and in an embodiment all of: the position of the geometry (e.g. surface or object) in the environment; the size of the geometry in question in the environment; any, e.g., surface, properties of the geometry that will affect the dispersal of light falling on the geometry in the environment, such as a measure of the reflectivity and/or light absorbance of the geometry, etc. The data representative of geometry could, and in an embodiment does, also comprise a model and/or prediction of how an (e.g. 3D) object may change over time. This may be appropriate where the objects will change over time, such as when considering plants that are growing in the environment in question.

The data representative of the light sources and geometry in the environment can be provided in any suitable and desired manner.

In one embodiment, this data is provided as an appropriate (e.g., and in an embodiment, 3D) model of the environment. Such a model may be generated to represent, e.g., the design of the environment (e.g. room) and/or building that the electronic device is intended to be used in. Such a model may be computer generated, e.g. as a CAD design or otherwise. Thus the data may be provided from, e.g., an appropriate design tool or pipeline.

In an embodiment, the data representative of the light source(s) and geometry in the environment is captured from the environment itself (is generated from analysis of the actual environment in question). In this case, the data is in an embodiment generated from one or more images of the environment itself. For example, and in an embodiment, one or more (and in an embodiment a plurality) of photographs of the environment in question could be captured and then analysed to generate data representative of the light source(s) and geometry in the environment.

Thus, in an embodiment, the technology described herein comprises taking one or more images of the environment, and analysing the images to derive data representative of the light source(s) and geometry in the environment that will then be used in the physically based lighting module to simulate the interaction of the light in the environment.

The images of the environment that are used may comprise, e.g., a photograph or photographs of the environment, and/or a video or videos of the environment.

In these arrangements, in an embodiment a plurality of images of the environment are captured, e.g., and in an embodiment, from different viewpoints (and view directions) in the environment.

In an embodiment, images are also or instead, and in an embodiment also, captured under different lighting conditions in the environment. For example, images may be captured with no artificial lighting and also with some or all of the artificial lighting on in the environment.

In an embodiment, an image is captured for plural, and in an embodiment for each, different lighting combination that would be possible in the environment. This could be achieved, for example, where there are plural artificial light sources, by taking a first set of images with one artificial light source on, a second set of images with a different artificial light source on, and so on, until all the artificial light sources have been considered. It would also be possible to take sets of images for different combinations of artificial light sources, if desired. It would also be possible, e.g., to take sets of images for different times of the day, so as to allow, e.g., for variations in natural light sources over a day, if desired.

It would also be possible, for example, to take photographs of the environment both with and without the use of flash, as that may provide further information relating to the way that light will interact with the environment (e.g. in terms of reflectivity and objects' surface properties, etc.). It would also be possible, if desired, to use data representative of the strength of the flash used when taking a photograph of the environment as part of the analysis of the environment from the photograph.

In an embodiment, an image with all the light sources active is used to analyse the geometry in the environment.

In an embodiment, the images of the environment are captured by a user who wishes to place the electronic device in the environment. The user may do this, for example, using a camera, e.g. on their phone, or another portable electronic device. The resultant photographs or video are in an embodiment then provided to an appropriate analysis engine which is able to analyse the images to generate the data representative of the light sources and geometry in the environment.

In an embodiment, the user can be, and is in an embodiment, guided as to which images to take of the environment, for example in terms of the different views of the environment and the different lighting conditions under which to take images of the views. This may be indicated, for example, by appropriate display to the user on their device.

The images of the environment can be analysed in any suitable and desired manner to derive data representative of the light sources and geometry in the environment. For example, the images may be, and are in an embodiment, used to determine the positions, sizes, types, etc., of the light sources and geometry (e.g. objects, walls, floors, surfaces, etc.) in the environment. The images may also be analysed to try to assess other, e.g. material, properties of objects and surfaces in the environment (e.g. that would or could have an effect on the dispersal of light falling on those objects and surfaces, such as their reflectivity, reflections, etc.).

The analysis of the images to determine the appropriate light source and geometry data may be performed in any suitable and desired manner, e.g. using any suitable and desired image analysis techniques, such as object recognition techniques, etc. For example, a database of reference images and corresponding light source and geometry (e.g. surface) properties may be used to identify the properties of light sources and geometry in the environment from the images of the environment. It would also be possible, e.g., to use machine learning techniques to improve the analysis of images of an environment over time.

It would also be possible to allow a user to feed (appropriate) parameters and data into the environment model/analysis, if desired.

It would also be possible to use a combination of captured images of the environment and modelling (e.g. computer-generated models) of the environment (or of elements of the environment), if desired.

The physically based lighting model can simulate the interaction of the light from the light sources with the geometry in the environment in any suitable and desired manner. The model is in an embodiment operable to predict light intensity over time (with some desired degree of accuracy) for locations in the environment. In an embodiment, the model is operable to predict how light from the light sources will fall on objects and surfaces in the environment based on the data representative of the light sources and geometry in the environment. The model is in an embodiment operable to identify whether a surface or object (geometry) in the environment will be in shadow or not.

Any suitable and desired physically based lighting model that can simulate the interaction of light with geometry in an environment can be used for this purpose. However, in an embodiment, a physically based lighting model that is used to determine lighting effects in graphics processing (computer graphics processing) is used for this purpose. Thus in an embodiment, a computer graphics processing physically based lighting model (engine) that is used for rendering computer graphics images for display (e.g. in a computer game (game engine)) is used to simulate the interaction of the light from the light source(s) with the geometry in the environment.

The Applicants have recognised in this regard that the models used to simulate lighting of a scene when rendering views of a scene for display in graphics processing can also (and advantageously) be used for simulating the interaction of light from light sources and geometry in an environment for the purposes of predicting the amount of light that will be received at different locations in that environment. Accordingly, the use of such graphics processing physically based lighting models can advantageously be used in the context of the technology described herein, namely to assist in predicting the amount of light energy that would be available at different locations in an environment for the purposes of identifying suitable locations for light energy harvesting electronic devices within an environment.

Any suitable graphics processing physically based lighting model can be used for this purpose.

In an embodiment a modified version of a graphics processing physically based lighting model is used in the technology described herein, in which the graphics processing lighting module has been adapted to account for the light energy harvesting properties of the device or devices in question (e.g., and in an embodiment, to be configured to be applicable for the use of photovoltaic cells, rather than simply using the, e.g., RGB model used to target the (typical) human eye that may be used in a graphics processing lighting model when rendering images for display). Thus, in an embodiment, a physically based lighting model that has been adapted from a graphics processing lighting model is used to simulate the interaction of the light from the light source or sources with the geometry in the environment based on the data representative of the light source or sources and geometry in the environment.

As well as using data representative of the light sources and geometry in the environment, the physically based lighting model can, and in an embodiment does, use other data that may be relevant to the lighting in the environment when simulating the interaction of the light from the light sources with the geometry in the environment. Such additional data may be any suitable and desired data relating to factors that could affect the lighting in the environment.

In one embodiment, this further data that is used comprises data representative of geometry that is outside the environment, such as the geometry of buildings and/or geographical features such as mountains, that could affect natural light sources (e.g. windows) in the environment. This is in an embodiment done where the environment includes a natural light source or sources, such as a window or windows.

In an embodiment where the environment includes a natural light source, such as a window or windows, the physically based lighting model also uses as an input data representative of the geometry of the sun, and/or data representative of the sun's path relative to the environment (e.g., and in an embodiment, relative to the natural light sources, such as windows, in the environment). Data relating to the path of the sun may comprise, for example, data indicative of sunset and sunrise for the environment, and/or more complex data indicative of the path of the sun relative to a natural light source or sources of the environment.

In an embodiment, the physically based lighting model also uses as an input one or more of and in an embodiment all of: data indicative of weather that could affect the natural light in the environment (where the environment includes a natural light source); and data indicative of the usage of the environment, for example, and in an embodiment, in relation to how such usage may affect the use (e.g. availability) of the light sources (whether natural or artificial) in the environment.

Other arrangements would, of course, be possible.

The simulation of the interaction of the light from the light source or sources with the geometry in the environment can be used to predict the amount of light energy that will be available at different locations in the environment in any suitable and desired manner. In an embodiment the amount of light energy that will be available is predicted for plural different locations in the environment.

The locations in the environment for which the amount of light energy that will be available is predicted can be any suitable and desired locations in the environment. They are in an embodiment at least locations that may be suitable for locating the electronic device in question.

In an embodiment, the different locations in the environment comprise different locations on a surface or surfaces in the environment, such as, and in an embodiment, locations on a wall or walls and/or the ceiling or floor of the environment. Thus, in an embodiment, the amount of light energy that will be available at different locations on at least one, and in an embodiment on plural, and in an embodiment on each, surface that an electronic device may be mounted on in the environment is determined.

Correspondingly, in an embodiment each location in the environment for which the amount of light energy that will be available is predicted comprises a respective region (area) of, e.g., and in an embodiment, a surface (such as a wall) in the environment.

In one embodiment, a surface or surfaces in the environment (such as the walls, ceiling and/or floor) is divided into respective smaller areas (sub-regions), and the simulation of the interaction of the light from the light sources with the geometry in the environment is used to predict the amount of light energy (in an embodiment in terms of the amount of luminous flux) that will be available from the light source(s) on and for a, and in an embodiment plural, and in an embodiment each, respective sub-region that the surface(s) in the environment to be considered are divided into.

The surface sub-regions in this regard can comprise any suitable and desired smaller areas of the surface in question, such as areas having sides of a few centimetres up to a few tens of centimetres (e.g. either a rectangle or square). For example, 10 cm×10 cm areas may be considered. The size of the areas may, for example, be based on the size of the electronic device in question.

In an embodiment, the amount of light energy that will be available from the light source(s) is predicted for plural (sampling) positions of a sampling (data) position grid that represents a surface or surfaces in the environment (such as the walls, ceiling and/or floor). In this case, the resolution of the data (sampling) position grid can be selected as desired, e.g. based on the size of the environment and/or of the electronic device in question.

The simulated interaction of the light from the light source or sources with the geometry in the environment can be used to predict the amount of light energy that will be available at the different locations in the environment in any suitable and desired manner. In an embodiment, the simulation is used to predict (determine) a measure of the luminous flux falling on the different locations in the environment. This can be done in any suitable and desired manner, for example by summing the total amount of luminous flux falling on a location in the environment from all the light sources based on the simulated interaction of the light from the light source or sources with the geometry.

It would be possible to simulate the interaction of the light from the light source(s) with the geometry of the environment for one set of lighting conditions and to then use that simulation to predict (and as a measure of) the amount of light energy that will be available at different locations in the environment (and in one embodiment, this is what is done).

However, in an embodiment, plural simulations of the interaction of the light from the light source or sources with the geometry in the environment, each having different lighting conditions, are determined, and then the results of those simulations combined (in an appropriate manner) to provide a prediction of the amount of light energy that will be available at different locations in the environment.

For example, in an embodiment, simulations representative of the lighting conditions at different times over a particular, in an embodiment selected, time period (such as, and in an embodiment a day (24 hours), during working hours, etc.) in the environment are performed, and then combined appropriately (e.g. summed) to provide a measure of the amount of light energy that will be received at different locations in the environment over the time period in question (e.g. over 24 hours). In this case, the simulation of the interaction of the light from the light sources with the geometry in the environment in an embodiment takes account of factors that will change over the time period in question (e.g. over the course of a day), such as the availability and position of natural light in the environment, and the availability of artificial light sources in the environment. The analysis of natural light sources (e.g. windows) could also, for example, be configured to take account of weather conditions, the presence and position of the sun, etc., at different times during the time period (e.g. the day), as desired.

It would also be possible to consider the variation in the lighting conditions over periods greater than a day, such as over a number of months or an entire year, if desired (and in an embodiment, this is what is done). In this case, the simulation of the lighting conditions in an embodiment also takes account of any changes in the lighting conditions that occur during the (longer) time period in question (e.g. the year), such as natural light source variability caused by changing seasons, and/or by changing usage of the environment during the time period (e.g. months or year) in question. This would then allow the light energy that was received at different locations in the environment over much longer periods to be predicted and thereby used when trying to identify suitable locations for the electronic device or devices in question.

Thus, in an embodiment, plural simulations of the interaction of the light from the light sources with the geometry in the environment are determined so as to take account of (and simulate) the propagation of light from the light sources over a given time period, such as the course of a day and/or across the seasons.

Thus, in an embodiment, the technology described herein comprises using a physically based lighting model to simulate the interaction of light from the light source or sources with the geometry in the environment for a plurality of different lighting conditions, such as, and in an embodiment, at different times over a particular, and in an embodiment selected, overall period of time (such as a day or a year), and then using those plural simulations to predict the amount of light energy that will be available at different locations in the environment.

Where plural light interaction simulations are generated, then those can be used to predict the amount of light energy that will be received at different locations in the environment in any suitable and desired manner.

For example, the lowest amount of light at each different location across the set of simulations could be determined and used as the amount of light energy that will be available at the location in question.

In an embodiment, the plural simulations are combined in some way so as to provide a prediction of the amount of light energy that will be available at different locations in the environment. In this case, a sum (total) of the light energy from each simulation (or from a selected subset of the simulations) of the set of simulations could be used as a measure of the amount of light energy that will be available at different locations in the environment, and/or each or a subset of the simulations could be averaged so as to provide an average amount of light energy that will be available at different locations in the environment.

In an embodiment a profile over time of the luminous flux at the location (e.g. surface) in question is determined. In an embodiment an integral of the luminous flux per unit area (at a given location) over the time period in question is determined.

Other arrangements would, of course, be possible.

Once the amount of light energy that will be available at different locations in the environment has been predicted, then that information can be, and is in an embodiment, used to identify a location or locations suitable for the light energy harvesting electronic device in the environment. This can be done in any suitable and desired manner.

In an embodiment, a representation of the available light energy (e.g. luminous flux) at different locations in the environment is presented (e.g., and in an embodiment, displayed) to a user, thereby to allow the user to identify a location or locations suitable for the electronic device in the environment.

Thus, in an embodiment, the technology described herein further comprises providing a display indicative of the predicted amount of light energy that will be available at different locations in the environment, thereby to allow a location or locations suitable for the light energy harvesting electronic device in the environment to be identified.

The predicted amount of light energy can be displayed in any suitable and desired form. For example, a profile of the light energy (e.g. luminous flux) available at a given location or locations in the environment could be displayed so as to, for example, allow a user to identify the amount of light energy that would be received at the different locations.

It would also be possible, e.g., to provide a list of locations together with a measure of their predicted light energy so as to allow the possible locations for the electronic device to be identified.

In an embodiment, the predicted available light energy at the different locations is displayed by providing an indication of the available amount of light energy that has been predicted on an image or images of the local environment itself. In an embodiment, the predicted available light energy at the different locations is used to provide a display that provides an indication of the suitability of different locations in the environment for locating a or the electronic device.

This could be provided, for example, and in an embodiment, in the form of a "colour" or "heat map" laid over an image of the local environment, indicating the amount of light energy/suitability predicted at different locations in the image of the local environment. This will then more straightforwardly facilitate a user identifying suitable locations in the environment for the electronic device.

In such an embodiment (or otherwise), the predicted available light energy at different locations in the environment is compared to one or more "light energy" thresholds, and the display is then arranged to indicate which locations have light energy availability that exceeds a given threshold or not.

In an embodiment thresholds indicative of "minimum", "some" and "enough" energy availability/suitability are used.

For example, there could be a first threshold representative of a predicted amount of light energy that will be sufficient to power the electronic device and another threshold indicative of a predicted amount of light energy that will definitely be insufficient to power an electronic device, with different locations then being indicated according to whether their predicted amount of available light energy is greater or less than the respective thresholds.

For example, a location could be indicated using a first colour (e.g. green) if its predicted amount of light energy is above the threshold that will definitely provide sufficient light energy for powering the device, and shown in another colour (e.g. red) if the predicted amount of light energy is below the threshold that indicates that the amount of energy is definitely less than is required to power the device. Any regions whose predicted amount of light energy that falls between the two thresholds could be shown in a third colour, e.g. yellow.

In these arrangements, the respective light energy thresholds can be set as desired, e.g., and in an embodiment, depending upon the electronic device or devices that is being considered (and in particular on its (known) power requirements).

Thus, in an embodiment, the display operates to indicate locations that are good (and conversely locations that are "bad") for locating the electronic device.

The display representing the amount of energy that will be received at different locations in the environment may, for example, be stored for later use.

In an embodiment, it is displayed to a user so that they can use the display when placing the electronic device in the environment. In an embodiment, the representation of the amount of light energy that will be available/suitable at different locations in the environment is displayed to a user using augmented reality (AR) or virtual reality (VR) display techniques. This will then allow a user more straightforwardly to identify appropriate locations in the environment for the electronic device, and to, as will be discussed further below, install the electronic device in the environment in a more interactive manner.

Thus, in an embodiment, the technology described herein comprises displaying a representation of the environment that is indicative of the predicted amount of light energy that will be available/suitable at different locations in the environment using augmented reality or virtual reality display techniques. This is in an embodiment done using a head-mounted display.

In an embodiment, as well as taking account of the predicted amount of light energy that will be available/suitable at different locations in the environment, the display indicating the suitability of the different locations in the environment for the electronic device takes account of, and is based on, one or more other factors in addition to the predicted amount of light energy, that could affect the suitability of a location for the electronic device in the environment.

Any suitable and desired factors or criteria that could affect the suitability of a location in the environment for an electronic device can be considered in this regard.

In an embodiment, where the electronic device is intended to communicate with other electronic devices in the environment (e.g. as part of an Internet of Things network), then in an embodiment, the communication with the other electronic device or devices is taken account of when indicating the suitability of the locations in the environment for the electronic device.

This in an embodiment takes account of, for example, the network communications requirements and/or topology of the communications network (mesh) that the electronic device is to be part of. This may take account, for example, of any necessary proximity to other electronic devices in the environment for communication purposes, the devices' transmit power and/or receive sensitivity, etc.

It may also take account, for example, of the resilience of electronic devices that are acting as nodes in the communications network.

In an embodiment, the presentation of the suitability of the location or locations in the environment for the electronic device also takes account of (and is based on) one or more of, and in an embodiment plural, and in an embodiment all of: the intended functionality of the electronic device (e.g. its sensor function); the (known or predicted) use of the environment (e.g. in terms of usage (work) patterns and locations in the environment); any environmental factors in the environment (such as temperature) that may affect the operation of the electronic device; and any special utility factors that may affect the positioning of the electronic device in the environment.

In an embodiment, the display indicating the suitability of the location or locations in the environment for the electronic device also takes account of, and is based on, one or more properties of the electronic device, such as its light energy harvesting capabilities (photovoltaic properties, e.g. the size of its solar panel), the capacity of its internal power supply (e.g. battery), whether it can also receive mains power; the intended functionality of the device; etc.

The process in an embodiment also takes account of any known predicted ageing properties of the electronic device, e.g. in terms of the effects of ageing on the battery and/or photovoltaic cells of the device over time.

The process in an embodiment also takes account of the battery charging/draining cycle of the electronic device and, e.g., and in an embodiment, the interaction of the light availability at the location or locations in the environment with the battery charging/draining cycle.

In this regard, as well as using the predicted amount of light energy that will be available at different locations in the environment to identify suitable locations for an electronic device in an environment, it would also be possible to use the predicted amount of light energy to select the electronic device to use in an environment (e.g. based on the predicted amount of light energy and what form of device would be able to operate using that predicted amount of light energy). Thus in an embodiment, the predicted amount of light energy that will be available at different locations in the environment is also used to select the electronic device that is to be used in the environment, e.g., and in an embodiment, from a set of plural electronic devices. It would also or instead be possible to use the predicted amount of light energy to select or set appropriate parameters for an electronic device, such as to select the size of the battery and/or photovoltaic cells to be used for the device, whether the device should be connected to mains power, etc.

In an embodiment, the display of the suitability of the location or locations in the environment for the electronic device is used to guide a user in the environment itself to assist the user in locating and installing the electronic device in the environment. This is in an embodiment done, as discussed above, by displaying the information indicating the suitability of the location or locations for the electronic device in the environment to the user, in an embodiment using an augmented reality or virtual reality display (representing the environment).

Thus, in an embodiment, there is accordingly an interactive display process that indicates suitable locations for the electronic device to the user, with the user then being guided by that display so as to place the device in the environment.

In this case, in an embodiment, as well as providing guidance to the user in the environment for installing the electronic device in the environment, the system is also operable to provision and install the electronic device in the environment itself. This may comprise, for example, as well as guiding the user to place the device in a suitable location in the environment, then instructing the user via the display to set up the device for the first time (to initiate the device). This may comprise, for example, guiding the user to perform appropriate initialisation inputs to the electronic device, and/or providing some form of input or signal, e.g. from the device that is being used to display the location indicating information to the user, to the electronic device to initiate it. Such a signal could comprise, for example, either the user, or automatically, triggering the flash on the user's device so as to activate the electronic device once it is positioned.

In an embodiment, the process is also operable to identify and record the location of the device once it has been placed in the environment. This can be achieved as desired. For example the device itself could be triggered to send its location to an appropriate control device for the system (e.g. network) that the electronic device is to be part of.

In an embodiment, the device that is displaying to the user the suitability of the locations for the electronic device is also used and operable to record and identify the location of the device in the environment once it has been placed in the environment. This could be achieved, for example, by having the user take an image (e.g. photograph) of the device once it is installed in the environment and then appropriately analysing that image to identify the location of the device in the environment. It would also or instead be possible where the display of the location indicating environment can be interacted with by a user, for a user to, e.g., be able to interact with that display to indicate the location of the device once it has been placed in the environment via the display.

Although the technology described herein has been described above primarily with reference to the identification of a location suitable for a given electronic device in an environment, as will be appreciated by those skilled in the art, the technology described herein can be used for any desired number of electronic devices that it may be desired to place in an environment.

In this case, the predicted amount of light energy may be, and is in an embodiment, used to identify a location or locations suitable for plural electronic devices (e.g. for each device that it is desired to place in the environment).

In this case, the display of the suitability of the locations for the electronic devices could be modified in an iterative fashion as devices are placed in the environment, so as to indicate suitable locations for any remaining devices to be placed based on the placement of other devices in the environment. Correspondingly, the display of the location(s) suitable for the electronic devices in an embodiment takes account of any required relationships (e.g. communications) between the plural electronic devices that are to be placed in the environment.

It would also be possible, for example, to use the predicted availability/suitability of the light energy in the environment in combination with a network topology planning/optimisation process (e.g. algorithm) to, e.g., plan or select the number of nodes in, e.g., a mesh or network, of electronic devices, based on the predicted availability/suitability of the light energy in the environment, if desired.

The method and apparatus of the technology described herein can be implemented in any suitable and desired fashion, and is applicable to and can be used in any data processing system.

They are in an embodiment implemented by means of an appropriate application or applications executing on a processor or processors, e.g., and in an embodiment, of a data processing system.

The apparatus and/or data processing system may and in an embodiment does also comprise one or more of, and in an embodiment all of: a central processing unit (a host processor), a graphics processing unit, a display controller, a system bus, a memory controller, a display, and a memory. The memory in an embodiment comprises a main memory (e.g. that is shared with a central processing unit (CPU)) of the overall data processing system. The display may be any suitable and desired display, such as for example, a screen. It may comprise the overall data processing system's (device's) local display (screen) and/or an external display.

The apparatus and/or data processing system in an embodiment comprises, and/or is in communication with, one or more memories and/or memory devices that store the data described herein, and/or store software for performing the processes described herein.

The technology described herein could be implemented, for example, using a personal computer that, for example, is operable to receive and/or generate the data representative of the light source or sources and the geometry in the environment and to then execute the physically based lighting model and to predict the amount of light energy that will be available at different locations in the environment and to then provide an appropriate display, e.g. on a display screen, to the user to assist in identifying suitable locations for a light energy harvesting electronic device in the environment.

In an embodiment, the technology described herein is provided on and implemented, at least in part, by a portable electronic device, such as a mobile phone or tablet. In this case, the technology described herein may be, and in an embodiment is, implemented by means of an appropriate application executing on the portable device (e.g. mobile phone) that is operable to perform one or more or all of the steps and stages of the technology described herein.

In this case, all of the operations of the embodiments of the technology described herein, such as analysing views of the environment to generate data representative of the light source(s) and geometry in the environment, the execution of a physically based lighting module to simulate the interaction of the light with the geometry in the environment, and the subsequent generation therefrom of a prediction of the amount of light energy that is available at different locations in the environment, may, for example, be performed entirely on the portable electronic device itself (e.g. where it has the processing capability and resources to do that).

In this case therefore, the application is in an embodiment operable to guide a user to use a camera of the portable electronic device to take appropriate views of the environment, and then uses an image analysis engine executing on the portable electronic device that is operable to analyse the views of the environment, to generate data representative of the light source(s) and geometry in the environment.

The application is in an embodiment then operable to use a physically based lighting model (and/or to cause that model to be executed, for example by a graphics processing unit (graphics processor) of the portable electronic device) to simulate the interaction of the light from the light source or sources with the geometry in the environment, and to then generate therefrom a prediction of the amount of light energy that will be available at different locations in the environment, and to then generate from that prediction an appropriate display indicative of the suitability of locations in the environment for the light energy harvesting electronic device.

Alternatively, the application executing on the portable device (e.g. mobile phone) could be operable to communicate relevant data to, and receive relevant data, from a remote processor or processors (e.g. server or servers) with which it is in communication (e.g. via the Internet or another data network), with those remote processors (e.g. server or servers) then, e.g., and in an embodiment, performing, the more processing intensive operations of the technology described herein, such as the image analysis, physically based lighting model and light energy predictions, in response to data received from the application on the portable device, and then returning information appropriately to the application on the portable device to facilitate the appropriate display to, and interaction with, a user of the portable device (and in an embodiment, this is what is done).

Thus, the application executing on the portable device could, and in an embodiment does, use a remote server or servers, such as "cloud-based" processing, to perform some of the processing operations, such as the more complex and processing intensive operations of the technology described herein. In this case therefore, the overall process of the technology described herein will be performed by, and implemented in, a portable electronic device and one or more remote processors that are in communication with the portable electronic device.

In this case, the application is in an embodiment operable to guide a user to use a camera of the portable electronic device to take appropriate views of the environment and then transmits the photographs to an image analysis engine executing on a remote processor (e.g. server) that is then operable to analyse the photographs of the environment to generate data representative of the light sources and geometry in the environment.

The remote processor in an embodiment then uses a physically based lighting module to simulate the interaction of the light from the light source or sources with the geometry in the environment, and then generates therefrom a prediction of the amount of light energy that will be available at different locations in the environment, and then generates from that prediction data for providing an appropriate display indicative of the suitability of locations in the environment for the light energy harvesting electronic device, and returns the display data (e.g. frames to be displayed) to the application executing on the portable device, with the application then using the received display data to provide a display indicative of the suitability of locations in the environment for the light energy harvesting electronic device on the display of the portable device (e.g. mobile phone) that the user is using.

In an embodiment, particularly where the portable electronic device is a mobile phone, the application is operable to provide the display indicative of the suitability of locations in the environment for the light energy harvesting electronic device in the form of an augmented reality or virtual reality display. As discussed above, in an embodiment the application is also operable to assist with the installation and provisioning of the light energy harvesting electronic devices in the environment.

This then facilitates providing a system for installing light energy harvesting electronic devices, such as Internet of Things nodes, in an environment through the user using a portable electronic device, such as their mobile phone, to guide them through the installation. This can then provide more accurate, but still relatively straightforward and simple to use, installation of light energy harvesting electronic devices in an, e.g. indoor, environment.

It is believed that using a portable electronic device in this manner to install light energy harvesting electronic devices in an environment may new and advantageous in its own right.

Thus, a further embodiment of the technology described herein comprises a method of installing a light energy harvesting electronic device in an environment using a portable electronic device, the method comprising:

an application on the portable electronic device guiding a user of the portable electronic device by means of a display on the portable electronic device to take one or more images of an environment in which a light energy harvesting electronic device is to be installed using a camera of the portable electronic device, and providing the one or more images of the environment to an image analysis engine operable to analyse an image or images of an environment to generate data representative of a light source or sources and geometry in the environment;

the image analysis engine analysing the image or images taken of the environment to generate data representative of a light source or sources and geometry in the environment in which the light energy harvesting electronic device is to be installed, and providing the data representative of a light source or sources and geometry in the environment to a processor operable to use physically based lighting model to simulate the interaction of light from a light source or sources with geometry in an environment; and the processor operable to use a physically based lighting model using the physically based lighting model to simulate the interaction of the light from the light source or sources with the geometry in the environment based on the generated data representative of a light source or sources and geometry in the environment, and providing data indicative of the simulated interaction of the light from the light source or sources with the geometry in the environment to a processor operable to predict the amount of light energy that will be available at different locations in an environment using data indicative of a simulated interaction of light from a light source or sources with geometry in an environment; and the processor operable to use the simulated interaction of light from a light source or sources with geometry in an environment using the simulated interaction of the light from the light source or sources with the geometry in the environment to predict the amount of light energy that will be available at different locations in the environment, and providing to the application on the portable electronic device data for providing on the display of the portable electronic device a display indicating the suitability of locations in the environment for installing the light energy harvesting electronic device based on the predicted amount of light energy that will be available at different locations in the environment; and the application on the portable electronic device providing on the display of the portable electronic device a display indicating the suitability of locations in the environment for installing the light energy harvesting electronic device based on the data for providing on the display of the portable electronic device a display indicating the suitability of locations in the environment for installing the light energy harvesting electronic device.

Thus, a further embodiment of the technology described herein comprises a system for installing a light energy harvesting electronic device in an environment, the system comprising:

a portable electronic device comprising:
a camera;
a display;

a memory;

a processor operable to execute applications; and a graphics processing unit;

the system further comprising:

an image analysis engine operable to analyse an image or images of an environment to generate data representative of a light source or sources and geometry in the environment;

a physically based lighting model engine operable to use a physically based lighting model to simulate the interaction of light from a light source or sources with geometry in an environment based on data representative of a light source or sources and geometry in the environment;

a light energy prediction engine operable to protect the amount of light energy that will be available at different locations in an environment based on a simulated interaction of light from a light source or sources with geometry in an environment from the physically based lighting model engine; and a display data generating engine operable to generate data for providing a display on a portable electronic device indicating the suitability of locations in an environment for installing a light energy harvesting electronic device based on a predicted amount of light energy that will be available at different locations in an environment from the light energy prediction engine;

wherein:

the processor of the portable electronic device is operable to execute an application that is operable to:

guide a user of the portable electronic device by means of a display on the portable electronic device to take one or more images of an environment in which a light energy harvesting electronic device is to be installed using the camera of the portable electronic device, and to provide the one or more images of the environment to the image analysis engine operable to analyse an image or images of an environment to generate data representative of a light source or sources and geometry in the environment;

and to:

provide on the display of the portable electronic device a display indicating the suitability of locations in an environment for installing a light energy harvesting electronic device based on data for providing on the display of the portable electronic device a display indicating the suitability of locations in the environment for installing the light energy harvesting electronic device received from the display data generating engine.

As will be appreciated by those skilled in the art, these embodiments of the technology described herein can, and in an embodiment do, include any one or more or all of the features of the technology described herein described herein.

Thus, for example, the processor or processors (and engine or engines) that analyse the images, use the physically based lighting model to simulate the interaction of the light from the light source or sources with the geometry in the environment to predict the amount of light energy that will be available at different locations in the environment and that generate and provide to the application on the portable electronic device data for providing on the display of the portable electronic device a display indicating the suitability of locations in the environment for installing a light energy harvesting electronic device may be a processor or processors (engine or engines) of the portable electronic device itself, or may be, in an embodiment are, a remote processor or processors (e.g. remote server or servers) with which the portable electronic device (and application) are in communication with via an appropriate data network. Each processing operation may be executed by a separate processor, or they may all be performed by the same processor, as desired. (Correspondingly, the various "engines" may each execute on the same or different processors.)

Correspondingly, the steps of analysing the images of the environment, using the physically based lighting model to simulate the interaction of light from a light source or sources with the geometry in the environment, using the simulated interaction of the light from the light source or sources with the geometry in the environment to predict the amount of light energy that will be available in different locations in the environment, and the generation of data for providing on the display of the portable electronic device a display indicating the suitability of locations in the environment for installing the light energy harvesting electronic device may all (or at least in part) be performed on the portable electronic device, or may all (or at least in part) be performed other than on the portable electronic device, such as, and in an embodiment, on a remote processor or processors (server or servers) that the portable electronic device is in communication with.

Thus providing the data to a processor or processors (engine or engines) may, for example, comprise transmitting that data (e.g. images of the environment) from the portable electronic device to a remote server or servers. Correspondingly, the (application on the) portable electronic device may receive data for providing on the display of the portable electronic device a display indicating the suitability of locations in the environment for installing the light energy harvesting electronic device from a remote processor or processors (server or servers).

The application in an embodiment displays images on the display of the electronic device to guide a user of the portable electronic device to take one or more images of the environment.

The display showing the suitability of locations in the environment for installing the light energy harvesting electronic devices is in an embodiment provided by means of an augmented reality or virtual reality display via the portable electronic device. Similarly, in an embodiment a user is able to interact with the display on the portable electronic device so as to initialise and set up the light energy harvesting electronic device once it has been installed in the environment, and/or to provide a record of the installed location of the light energy harvesting electronic device in the environment.

The portable electronic device in an embodiment comprises a mobile telephone or tablet.

The technology described herein can be implemented in any suitable system, such as a suitably configured microprocessor based system. In an embodiment, the technology described herein is implemented in a computer and/or micro-processor based system.

The various functions of the technology described herein can be carried out in any desired and suitable manner. For example, the functions of the technology described herein can be implemented in hardware or software, as desired. Thus, for example, unless otherwise indicated, the various functional elements, engines, stages, and "means" of the technology described herein may comprise a suitable processor or processors, controller or controllers, functional units, circuitry, processing logic, microprocessor arrangements, etc., that are operable to perform the various functions, etc., such as appropriately dedicated hardware elements (processing circuitry) and/or programmable hardware elements (processing circuitry) that can be programmed to operate in the desired manner.

It should also be noted here that, as will be appreciated by those skilled in the art, the various functions, etc., of the technology described herein may be duplicated and/or carried out in parallel on a given processor. Equally, the various processing stages may share processing circuitry, etc., if desired.

It will also be appreciated by those skilled in the art that all of the described embodiments of the technology described herein can, and in an embodiment do, include, as appropriate, any one or more or all of the features described herein.

The methods in accordance with the technology described herein may be implemented at least partially using software e.g. computer programs. It will thus be seen that when viewed from further embodiments the technology described herein provides computer software specifically adapted to carry out the methods herein described when installed on a data processor, a computer program element comprising computer software code portions for performing the methods herein described when the program element is run on a data processor, and a computer program comprising code adapted to perform all the steps of a method or of the methods herein described when the program is run on a data processing system. The data processor may be a microprocessor system, a programmable FPGA (field programmable gate array), etc.

The technology described herein also extends to a computer software carrier comprising such software which when used to operate a display controller, or microprocessor system comprising a data processor causes in conjunction with said data processor said controller or system to carry out the steps of the methods of the technology described herein. Such a computer software carrier could be a physical storage medium such as a ROM chip, CD ROM, RAM, flash memory, or disk, or could be a signal such as an electronic signal over wires, an optical signal or a radio signal such as to a satellite or the like.

It will further be appreciated that not all steps of the methods of the technology described herein need be carried out by computer software and thus from a further broad embodiment the technology described herein provides computer software and such software installed on a computer software carrier for carrying out at least one of the steps of the methods set out herein.

The technology described herein may accordingly suitably be embodied as a computer program product for use with a computer system. Such an implementation may comprise a series of computer readable instructions either fixed on a tangible, non-transitory medium, such as a computer readable medium, for example, diskette, CD-ROM, ROM, RAM, flash memory, or hard disk. It could also comprise a series of computer readable instructions transmittable to a computer system, via a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, preloaded with a computer system, for example, on a system ROM or fixed disk, or distributed from a server or electronic bulletin board over a network, for example, the Internet or World Wide Web.

As discussed above, the technology described herein relates to the placing of light energy harvesting electronic devices, such as Internet of Things devices (nodes), in an, e.g. indoor, environment, such as a room in a building.

FIG. 1 schematically illustrates an Internet of Things device (node) 1. The Internet of Things device 1 has a central processor 2 provided with an operating system 3, a storage device 4 (which may, for example, be a non-volatile, e.g. flash, memory), sensors 5, 6, and communications circuitry 7.

The sensors 5, 6, may be, for example, a temperature sensor, an humidity sensor, a movement sensor, a light sensor, etc., depending on the function of the Internet of Things device 1.

The communications circuitry 7 may be any suitable and desired circuitry that facilitates wireless communication between the Internet of Things device 1 and another Internet of Things device or other electronic device, whether in the same indoor environment or otherwise. Thus it may, for example, comprise appropriate Wi-Fi, Bluetooth or other short range radio communication circuitry.

As shown in FIG. 1, the Internet of Things device 1 also includes an internal power supply in the form of a battery 8, and photovoltaic cells 9 that are operable to harvest light energy from the environment in which the Internet of Things device 1 is placed so as to provide power to and recharge the battery 8.

As discussed above, an important aspect of the placement of an Internet of Things device, such as the device illustrated in FIG. 1, in an environment, is the placement of the device so that it will be able to harvest sufficient light energy so as to meet its power requirements.

Figure 2:
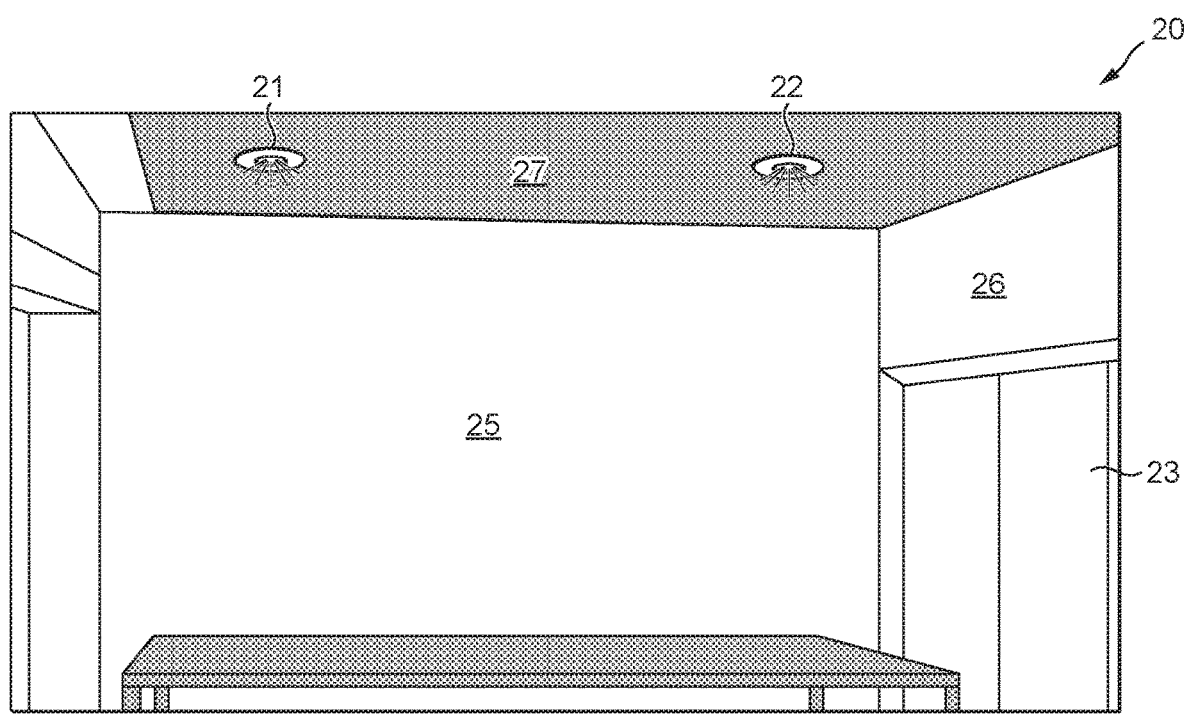
FIG. 2 shows schematically an exemplary indoor environment.

FIG. 2 shows an exemplary indoor environment 20 in which an Internet of Things device such as that shown in FIG. 1 may be desired to be placed. The indoor environment 20 comprises in this example a room that includes, for example, artificial light sources 21, 22 in the form of lights, a natural light source 23 in the form of a window, an object 24 in the form of a table and walls 25, 26 and a ceiling 27.

Other arrangements for the indoor environment would, of course, be possible.

In the present embodiments, and in accordance with the technology described herein, the amount of light energy that will be available at different locations in the indoor environment 20 from the light sources 21, 22 and 23 in the indoor environment is predicted based on and using data representative of the light sources and the geometry in the indoor environment.

The predicted amount of light energy at different locations in the indoor environment is then used to generate a display to the user indicating the suitability of locations in the indoor environment for an Internet of Things device that is to be placed in the indoor environment 20.

Figure 3:
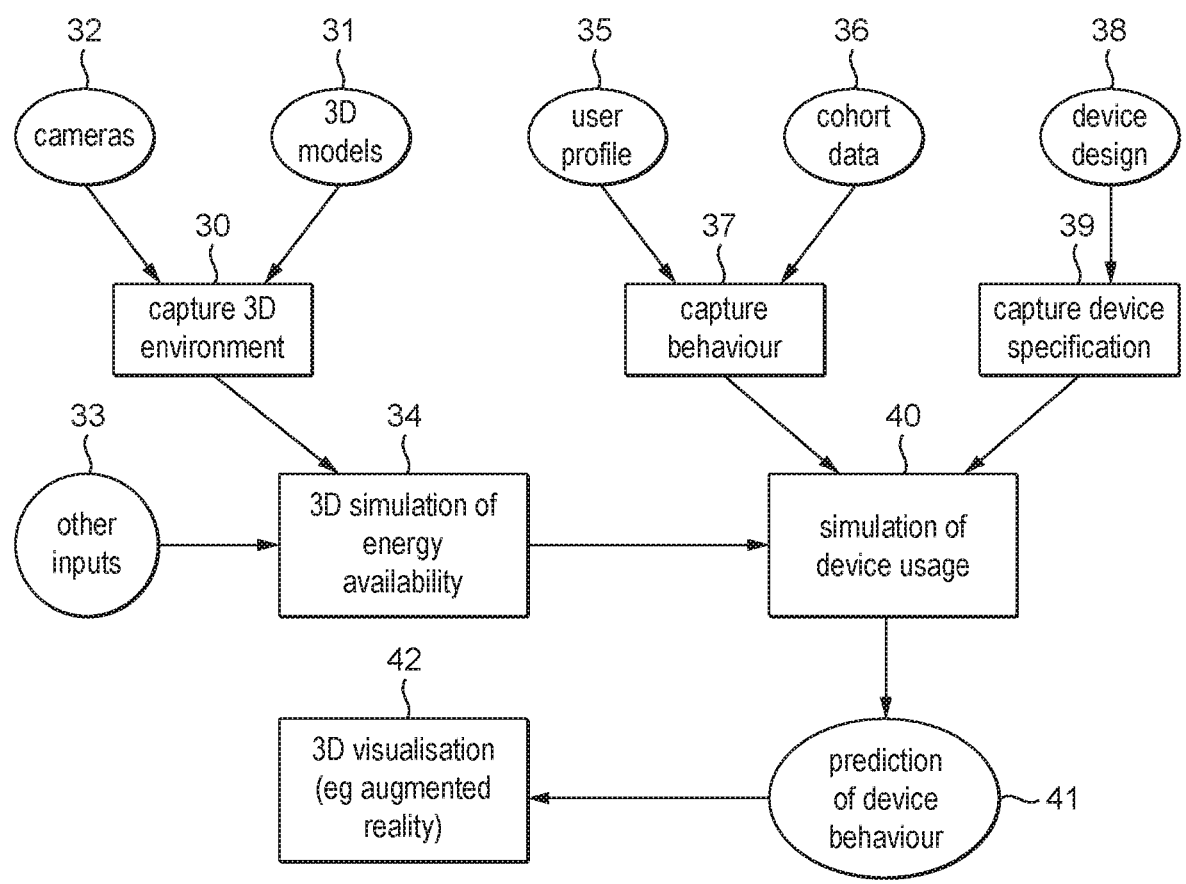
FIG. 3 shows schematically the operation in an embodiment of the technology described herein.

FIG. 3 shows schematically the operation in the present embodiment of predicting the amount of light energy that will be available at different locations in an environment and then using that prediction to provide a display indicative of the suitability of different locations in the environment for an Internet of Things device.

As shown in FIG. 3, the process starts by generating data representative of the light sources and geometry in the environment in which the Internet of Things device (the light energy harvesting electronic device) is to be located (step 30).

This process may use as its input one or more three dimensional models of the environment 31, and/or one or more images 32 of the environment that have been captured, e.g. using a camera or cameras. In the latter case, the image or images of the environment are appropriately analysed (e.g. using appropriate image recognition techniques), to identify the different light sources and their properties, and correspondingly different objects and surfaces and their properties, in the environment.

The data that is representative of the environment that is generated from the 3D models 31 and/or images 32 comprises, for example, information indicative of the type, sizes and positions of the light sources, information indicative of the output (e.g. intensity, colour and/or spectrum) of the light sources, properties of geometry, such as surfaces and objects, in the environment that affect the dispersal of light within the environment (e.g. such as their reflectivity and/or light absorbency), etc.

In the present embodiment, images from different viewpoints and taken at different times (e.g. of the day and/or year) are used and analysed in order to generate data representative of the environment from different viewpoints and at different times, e.g. of the day. A user may, for example, be guided to take photographs of the environment from different viewpoints. Images under different lighting conditions may also be taken.

The so-generated 3D representation 30 of the environment 20 is then used, together with one or more other inputs 33, to simulate the interaction of the light from the light source or sources with the geometry in the environment, and that simulated interaction of the light from the light source or sources with the geometry is then used to generate a prediction (simulation) of the amount of light energy that will be available at different locations in the environment (step 34).

The other inputs 33 that may be used in this regard may comprise any suitable and desired other inputs that may affect the amount of available light energy at different locations within the environment, such as factors relating to the usage of the environment, weather data, the geometry and position of the sun over time relative to the environment (e.g. the times of sunset and sunrise for the environment), and the geometry of any objects external to the environment that may influence natural light sources of the environment, such as the geometry of nearby buildings or geographical features such as mountains or water.

The 3D simulation of the light energy availability 34 is generated from the information describing the 3D environment 30 of the environment and the other inputs 33 in the present embodiment by using a physically based lighting model that is used to simulate lighting when rendering computer graphics images for display to simulate the interaction of the light from the light source or sources with the geometry in the environment. That simulated interaction of the light from the light sources with the geometry in the environment is then used to predict the amount of light energy that will be available at different locations in the environment. In the present embodiment, this is done so as to predict the amount of light energy that will be available at locations or positions at a particular resolution (sampling grid) within the environment.

Any suitable computer graphics physically based lighting model can be used for this purpose. In the present embodiment, a path-traced global illumination model is used.

Other arrangements would, of course, be possible.

Figure 4:
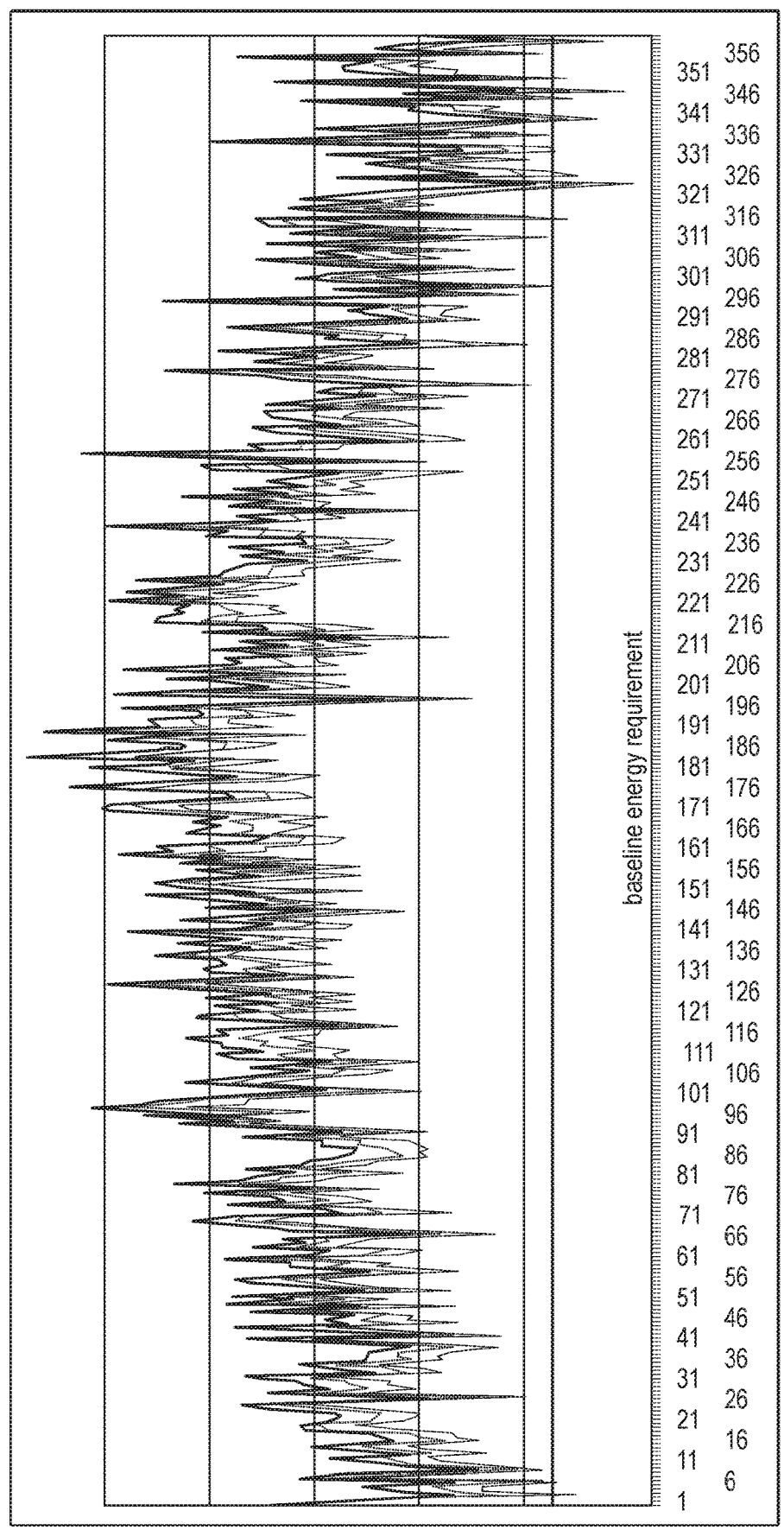
FIG. 4 shows schematically the predicted availability of light energy at different locations in an environment.

In the present embodiment, the simulation of the lighting energy availability 34 generates an indication of the daily light energy availability in different areas of the indoor environment 20 across the period of a year. FIG. 4 shows an exemplary output in this regard which indicates the daily light energy available in different areas of the indoor environment 20 across a year. (Each trace in FIG. 4 represents a different location in the indoor environment 20 and shows how the available light energy varies at that location over the course of a year.)

Other arrangements would, of course, be possible.

As shown in FIG. 3, as well as generating a simulation of the light energy availability 34 for the Internet of Things device 1 in the indoor environment 20, further information relating to the intended usage and requirements of the Internet of Things device 1 that is to be placed in the indoor environment 20 is determined and taken into account when guiding a user as to the placement of the Internet of Things device 1 in the indoor environment 20.

In particular, as shown in FIG. 3, user profile information 35 (which could, e.g., be information about the particular user, such as their (daily) routine, preferences, etc.), and cohort data 36 (which could, e.g., be anonymised collated data about similar environments (e.g. energy use, time taken to heat up, etc.)) relating to the likely usage of the Internet of Things device 1 and/or indoor environment 20 is captured and analysed to provide 37 an assessment of data relating to the usage of the device that is to be placed in the indoor environment.

Correspondingly, information 38 relating to the device itself (such as its power requirements, its light energy harvesting capabilities, battery, etc., is used to provide data indicative of the relevant properties of the device itself (step 39).

The determined energy availability 34, device specification 39, and user and environment behaviour 37 are then used together to generate an overall simulation of the usage of the device (step 40) in the indoor environment.

The simulation of the device usage 40 is then used together with information predictive of the likely device behaviour (e.g., how much energy it uses in standard operation; how much time it spends "awake" vs "asleep"; how often it fires up a transmitter to send data up to the cloud; how its performance may deteriorate due to ageing over time; etc.) (step 41) to generate a three dimensional visualisation of the indoor environment 20 that is indicative of the suitability of different locations in the indoor environment for placing the Internet of Things device 1 so as to meet its energy requirements (based on the simulated device usage, predicted device behaviour, and determined energy availability) (step 42).

In the present embodiment, as shown in FIG. 3, the information indicative of the suitability of different locations in the indoor environment for placing the Internet of Things device is shown in the form of a 3D visualisation of the indoor environment (e.g. using augmented reality or virtual reality) that overlays on (an image of) the indoor environment an indication of the suitability of locations in the indoor environment for the Internet of Things device.

Figure 5:
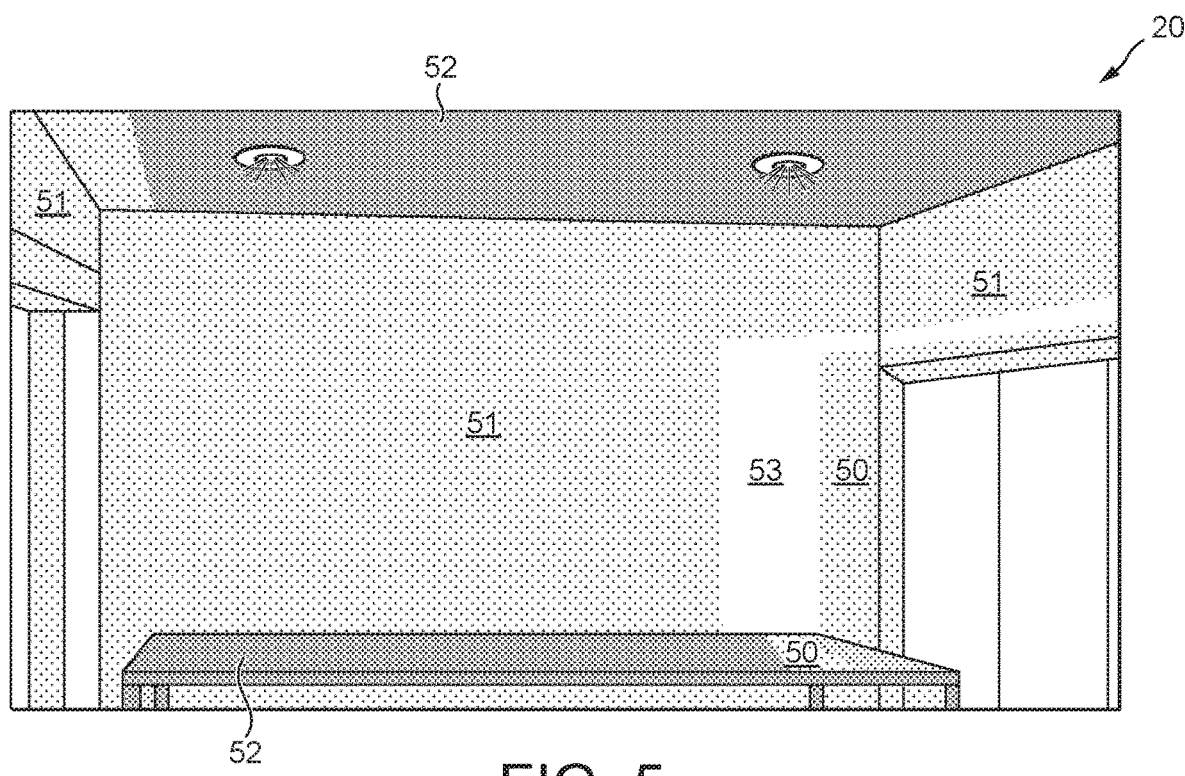
FIG. 5 shows schematically an embodiment of a visual display of an indoor environment indicating the suitability of different locations in the indoor environment for a light energy harvesting electronic device.

FIG. 5 shows an exemplary 3D visualisation of the indoor environment shown in FIG. 2 that indicates the suitability of locations within the indoor environment 20 using different colours (as a "heat map").

As shown in FIG. 5, locations 50 that have been determined as receiving more than sufficient light energy to power the Internet of Things device are indicated in a first colour 50 (e.g. green), locations 51, 52 that have been determined as not receiving sufficient light energy to power the Internet of Things device are indicated in a second colour (e.g. red), and regions 53 that fall between those two thresholds are indicated in a third colour (e.g. yellow). In this way, a user can more readily identify those locations that are or that may be suitable for locating the Internet of Things device in the indoor environment 20.

Figure 6:
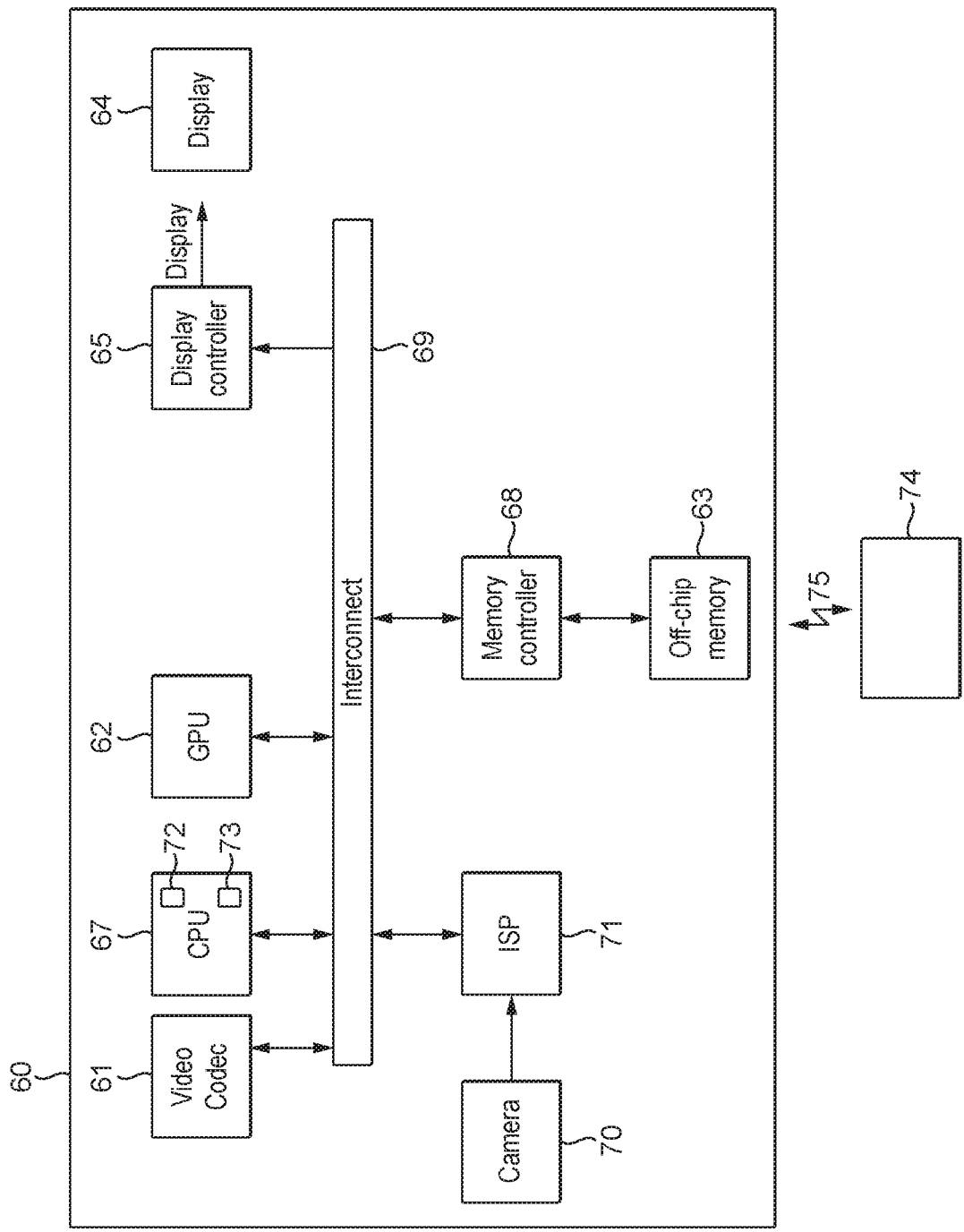
FIG. 6 shows schematically a portable electronic device that may be used to implement the described embodiment.

FIG. 6 shows schematically an exemplary portable electronic device, such as a mobile telephone or tablet, that may be used to implement the method and system of the present embodiment.

As shown in FIG. 6, the portable electronic device 60 includes a host processor comprising a central processing unit (CPU) 67, a graphics processing unit (GPU) 62, a video codec 61, a display controller 65, a display 64, a memory controller 68, main memory 63, a camera 70, and an image signal processor 71 (that receives image data from the camera 70).

As shown in FIG. 6, these units communicate via an interconnect 69 and have access to the main memory 63.

The portable electronic device 60 can also communicate (send data to and receive data from) a remote server (network) 74, e.g. via appropriate wireless transmission 75.

The use of a portable electronic device 60 as shown in FIG. 6 to install a light energy harvesting electronic device in an environment in an embodiment of the technology described herein will now be described with reference to FIG. 7.

Figure 7:
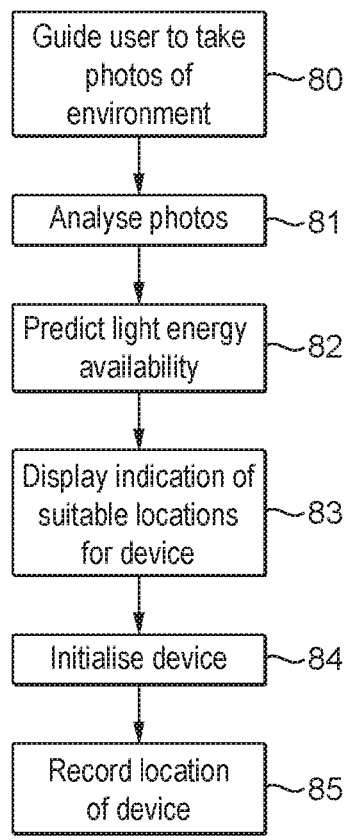
FIG. 7 shows schematically the operation of the portable electronic device shown in FIG. 6 in an embodiment of the technology described herein.

In the arrangement shown in FIG. 7, it is assumed that there is an application 72 installed on the portable electronic device 60 that executes on the CPU 67 of the portable electronic device 60 and that a user can activate when they wish to install a light energy harvesting electronic device in an environment.

As shown in FIG. 7, the application 72, once activated, is operable to guide a user to use the camera 70 of the portable electronic device 60 to first take appropriate photographs of the environment (step 80). This is done by providing an appropriate display on the display 64 to the user.

The application 72 then sends the photographs of the environment to an image analysis engine executing on a remote server 74 (e.g.) that analyses the photographs of the environment to generate data representative of the light source(s) and geometry in the environment (step 81). The image analysis engine in an embodiment uses the photograph data as it is produced by the camera 70 (i.e. without any processing by the ISP 71).

Once the photographs have been analysed and the data representative of the light source(s) and geometry in the environment generated therefrom, the remote server 74 executes a physically based lighting model to simulate the interaction of the light from the light source or sources with the geometry in the environment, and generates therefrom a prediction of the amount of light energy that will be available at different locations in the environment (step 82).

The remote server 74 then generates from this prediction data to generate a display indicative of the suitability of locations in the environment for the light energy harvesting electronic device, and returns this data to the application 72 which then uses that data to provide a display indicative of the suitability of locations in the environment for the light energy harvesting electronic device on the display of the portable electronic device 60 (step 83).

In the present embodiment this display indicative of the suitability of locations in the environment for the light energy harvesting electronic device is provided in the form of an augmented reality or virtual reality display via the display 64 of the portable electronic device 60. The portable electronic device 60 may, for example, be head-mounted so as to provide the guidance display in the form of virtual reality or augmented reality, if desired.

As shown in FIG. 7, as well as providing guidance to the user for installing the electronic device in the environment, the application 72 is also operable to guide a user to provision and initialise the light energy harvesting electronic device in the environment (step 84). In the present embodiment, this comprises instructing the user via the display 64 to set up the device for the first time (to initiate the device). This may comprise, for example, guiding the user to perform appropriate initialisation inputs to the electronic device, and/or providing some form of input or signal, e.g. from the portable electronic device 60 to the light energy harvesting electronic device to initiate it. Such a signal could comprise, for example, either the user, or automatically, triggering the flash on the portable electronic device 60 so as to activate the light energy harvesting electronic device once it is positioned.

As shown in FIG. 7, the application 72 is also operable to identify and record the location of the light energy harvesting electronic device once it has been placed in the environment (step 85). This can be achieved as desired. For example the light energy harvesting device itself could be triggered to send its location to an appropriate control device for the system (e.g. network) that it is to be part of, and/or the application 72 could instruct a user (e.g. via the display 64) to take a photograph of the light energy harvesting device once it is installed in the environment (and then, e.g., sends that photograph to the remote server 74 for analysis to identify (and record) the location of the light energy harvesting electronic device in the environment).

It would also be possible for more or all of the steps of FIG. 7 to be performed on the portable electronic device itself, if desired.

The present embodiment can be used for any desired number of electronic devices that it may be desired to place in an environment.

It would also be possible, for example, to use the predicted availability/suitability of the light energy in the environment in combination with a network topology planning/optimisation process (e.g. algorithm) to, e.g., plan or select the number of nodes (and their location) in, e.g., a mesh or network, of electronic devices, based on the predicted availability/suitability of the light energy in the environment, if desired.

Further variations, modifications and/or changes to the described embodiments of the technology described herein would be possible, if desired.

For example, as well as taking account of the predicted amount of light energy that will be available/suitable at different locations in the environment, the display indicating the suitability of the different locations in the environment for the electronic device could also take account of, and be based on one or more of: any communications requirements and/or topology of a communications network (mesh) that the electronic device is to be part of; the intended functionality of the electronic device (e.g. its sensor function); the (known or predicted) use of the environment (e.g. in terms of usage (work) patterns and locations in the environment); any environmental factors in the environment (such as temperature) that may affect the operation of the electronic device; any spatial utility factors that may affect the positioning of the electronic device in the environment; and one or more properties of the electronic device, such as its light energy harvesting capabilities (photovoltaic properties, e.g. the size of its solar panel), the capacity of its internal power supply (e.g. battery), whether it can also receive mains power; the intended functionality of the device, ageing properties of the electronic device, etc.

As will be appreciated from the above, the technology described herein, in its embodiments at least, provides a system for installing light energy harvesting electronic devices, such as Internet of Things nodes, in an, e.g. indoor, environment that can be implemented using a portable electronic device, such as a mobile phone, to guide a user through the installation. This can then provide more accurate, but still relatively straightforward and simple to use, installation of light energy harvesting electronic devices in an environment.

This is achieved, in the embodiments of the technology described herein at least, by using a physically based lighting model to simulate the interaction of light from a light source or sources with the geometry in an environment and then using the simulated interaction of the light from the light source or sources with the geometry in the environment to predict the amount of light energy that will be available at different locations in the environment.

The foregoing detailed description has been presented for the purposes of illustration and description. It is not intended to be exhaustive or to limit the technology described herein to the precise form disclosed. Many modifications and variations are possible in the light of the above teaching. The described embodiments were chosen in order to best explain the principles of the technology described herein and its practical applications, to thereby enable others skilled in the art to best utilise the technology described herein, in various embodiments and with various modifications as are suited to the particular use contemplated. It is intended that the scope be defined by the claims appended hereto.

The invention claimed is:

1. A method of identifying a location for a light energy harvesting electronic device within an environment, the method comprising:
 a processor generating data representative of a light source or sources and geometry in the environment in which the light energy harvesting electronic device is to be located by analyzing one or more images of the environment captured by a user within the environment wishing to place the light energy harvesting electronic device in the environment;
 the processor using a computer graphics processing physically based lighting model that is used for rendering computer graphics images for display to simulate the interaction of the light from the light source or sources with the geometry in the environment based on the data representative of a light source or sources and geometry in the environment, wherein the computer graphics processing physically based lighting model is adapted to account for the light energy harvesting properties of the light energy harvesting electronic device, wherein the geometry considered by the computer graphics processing physically based lighting model comprises surfaces within the environment, the surfaces comprising boundaries of the environment and one or more objects positioned within the environment, the computer graphics processing physically based lighting model taking account of the position, size and/or surface properties of the one or more objects positioned within the environment; and
 the processor using the simulated interaction of the light from the light source or sources with the geometry in the environment to predict the amount of light energy that will be available at different locations in the environment, thereby to allow a location or locations suitable for the light energy harvesting electronic device in the environment to be identified;
 the method further comprising displaying to said user within the environment, using augmented reality display techniques, a representation overlaid on the environment viewed by the user that is indicative of the suitability of different locations in the environment for locating a light energy harvesting electronic device based on the predicted amount of light energy that will be available, the display guiding the user to place the light energy harvesting electronic device in the environment.

2. The method of claim 1, comprising analyzing a plurality of images of the environment taken from different viewpoints in the environment and/or captured under different lighting conditions in the environment.

3. The method of claim 1, wherein:
 the physically based lighting model also uses as an input one or more of: data indicative of weather that could affect the natural light in the environment;
 data indicative of usage of the environment;
 data representative of geometry that is outside the environment that could affect natural light sources in the environment;
 data representative of the geometry of the sun relative to a natural light source or sources of the environment;
 data indicative of sunset and sunrise for the environment; and
 data indicative of the path of the sun relative to a natural light source or sources of the environment.

4. The method of claim 1, comprising:
 using plural simulations of the interaction of the light from the light source or sources with the geometry in the environment, each having different lighting conditions and/or corresponding to different times of day or year, to predict the amount of light energy that will be available at different locations in the environment.

5. The method of claim 1, wherein:
 the display indicating the suitability of the different locations in the environment for locating a light energy harvesting electronic device is based on one or more of:
 whether the light energy harvesting electronic device is intended to communicate with other electronic devices in the environment;
 communications requirements and/or topology of a communications network that the light energy harvesting electronic device is to be part of;
 intended functionality of the light energy harvesting electronic device;
 use of the environment;
 environmental factors in the environment that may affect the operation of the light energy harvesting electronic device; and
 one or more properties of the light energy harvesting electronic device.

6. The method of claim 1, further comprising:
displaying on the display of the portable electronic device instructions for setting up a light energy harvesting electronic device.

7. The method of claim 1, further comprising:
identifying and recording the location of the light energy harvesting electronic device once it has been placed in the environment.

8. The method of claim 1, wherein the graphics processing physically based lighting model is executed by a graphics processing unit of a portable electronic device.

9. The method of claim 1, wherein the light energy harvesting electronic device is an Internet of Things device, and the method comprises taking account of the device usage, comprising accounting for energy required by the device for transmitting data to the cloud.

10. The method of claim 1, wherein the display is provided on a head-mounted display.

11. The method of claim 10, wherein the heat map comprises a first colour at locations where the predicted amount of light energy is above a first threshold that will definitely provide sufficient light energy for powering the device, a second different colour at locations where the predicted amount of light energy is below a second threshold that indicates the amount of energy is definitely less than is required to power the device, and third different colour at locations where the amount of light is between the first and second thresholds.

12. The method of claim 1, wherein the representation displayed to the user within the environment using augmented reality comprises heat map overlaid on the environment viewed by the user.

13. A method of installing a light energy harvesting electronic device in an environment using a portable electronic device, the method comprising:
an application on the portable electronic device guiding a user of the portable electronic device within the environment by means of a display on the portable electronic device to take one or more images of an environment in which the light energy harvesting electronic device is to be installed using a camera of the portable electronic device, and providing the one or more images of the environment to an image analysis engine operable to analyze an image or images of an environment to generate data representative of a light source or sources and geometry in the environment;
the image analysis engine analyzing the image or images taken of the environment to generate data representative of the light source or sources and geometry in the environment in which the light energy harvesting electronic device is to be installed, and providing the data representative of the light source or sources and geometry in the environment to a processor operable to use a computer graphics processing physically based lighting model that is used for rendering computer graphics images for display to simulate the interaction of light from the light source or sources with geometry in an environment, wherein the computer graphics processing physically based lighting model is adapted to account for the light energy harvesting properties of the light energy harvesting electronic device; and
the processor operable to use the computer graphics processing physically based lighting model that is used for rendering computer graphics images for display using the computer graphics processing physically based lighting model to simulate the interaction of the light from the light source or sources with the geometry in the environment based on the generated data representative of the light source or sources and geometry in the environment, wherein the geometry considered by the computer graphics processing physically based lighting model comprises surfaces within the environment, the surfaces comprising boundaries of the environment and one or more objects positioned within the environment, the computer graphics graphics processing physically based lighting model taking account of the position, size and/or surface properties of the one or more objects positioned within the environment, and
said processor operable to use the computer graphics processing physically based lighting model providing data indicative of the simulated interaction of the light from the light source or sources with the geometry in the environment to a processor operable to predict the amount of light energy that will be available at different locations in an environment using data indicative of the simulated interaction of light from the light source or sources with geometry in the environment; and
the processor operable to use the simulated interaction of light from the light source or sources with geometry in an environment using the simulated interaction of the light from the light source or sources with the geometry in the environment to predict the amount of light energy that will be available at different locations in the environment, and providing to the application on the portable electronic device data for providing on the display of the portable electronic device a representation indicating the suitability of locations in the environment for installing the light energy harvesting electronic device based on the predicted amount of light energy that will be available at different locations in the environment; and
the application on the portable electronic device providing to the user within the environment on the display of the portable electronic device, using augmented reality display techniques, a representation overlaid on the environment viewed by the user indicating the suitability of locations in the environment for installing the light energy harvesting electronic device based on the data for providing on the display of the portable electronic device the representation indicating the suitability of locations in the environment for installing the light energy harvesting electronic device, the display guiding the user to place the light energy harvesting electronic device in the environment.

14. An apparatus for identifying a location for a light energy harvesting electronic device within an environment, the apparatus comprising:
at least one processor configured to:
generate data representative of a light source or sources and geometry in the environment by analyzing one or more images of the environment captured by a user within the environment wishing to place the light energy harvesting electronic device within the environment;
use a computer graphics processing physically based lighting model that is used for rendering computer graphics images for display to simulate the interaction of light from a light source or sources with geometry in an environment based on the data representative of a light source or sources and geometry in the environment, wherein the computer graphics processing physically based lighting model is adapted to account for the light energy harvesting properties of the one or more light energy harvesting electronic devices, wherein the geometry considered comprises surfaces within the environment, the surfaces comprising boundaries of the environment and one or more objects positioned within the environment, the computer graphics graphics processing physically based lighting model taking account of the position, size and/or surface properties of the one or more objects positioned within the environment;

use the simulated interaction of the light from the light source or sources with the geometry in the environment to predict the amount of light energy that will be available at different locations in the environment, thereby to allow a location or locations suitable for a light energy harvesting electronic device in the environment to be identified; and display to the user within the environment, using augmented reality display techniques, a representation overlaid on the environment viewed by the user that is indicative of the suitability of different locations in the environment for locating a light energy harvesting electronic device based on the predicted amount of light energy that will be available, the display guiding the user to place the light energy harvesting electronic device in the environment.

15. The apparatus of claim 14, wherein the at least one processor is further configured to:

identify and record the location of the light energy harvesting electronic device once it has been placed in the environment.

16. A non-transitory computer readable storage medium storing computer software code which when executing on a processor performs a method of identifying a location for a light energy harvesting electronic device within an environment, the method comprising:

generating data representative of a light source or sources and geometry in the environment in which the light energy harvesting electronic device is to be located by analyzing one or more images of the environment captured by a user within the environment wishing to position the light energy harvesting electronic device in the environment;

using a computer graphics processing physically based lighting model that is used for rendering computer graphics images for display to simulate the interaction of the light from the light source or sources with the geometry in the environment based on the data representative of a light source or sources and geometry in the environment, wherein the computer graphics processing physically based lighting model is adapted to account for the light energy harvesting properties of the light energy harvesting electronic device, wherein the geometry considered comprises surfaces within the environment, the surfaces comprising boundaries of the environment and one or more objects positioned within the environment, the computer graphics graphics processing physically based lighting model taking account of the position, size and/or surface properties of the one or more objects positioned within the environment; and using the simulated interaction of the light from the light source or sources with the geometry in the environment to predict the amount of light energy that will be available at different locations in the environment, thereby to allow a location or locations suitable for the light energy harvesting electronic device in the environment to be identified;

the method further comprising displaying to the user within the environment, using augmented reality display techniques, a representation overlaid on the environment viewed by the user that is indicative of the suitability of different locations in the environment for locating a light energy harvesting electronic device based on the predicted amount of light energy that will be available, the display guiding the user to place the light energy harvesting electronic device in the environment.

* * * * *